United States Patent [19]

Stack et al.

[11] 4,375,636
[45] Mar. 1, 1983

[54] AC SYNCHRO SIGNAL TO DIGITAL SIGNAL CONVERTER

[75] Inventors: Timothy F. Stack; George T. Shoemaker, both of Enfield, Conn.

[73] Assignee: United Technologies Corporation, Hartford, Conn.

[21] Appl. No.: 331,852

[22] Filed: Dec. 17, 1981

Related U.S. Application Data

[62] Division of Ser. No. 158,860, Jun. 12, 1980, Pat. No. 4,340,881.

[51] Int. Cl.³ ............................................. H03K 13/02
[52] U.S. Cl. .............................. 340/347 SY; 318/661; 340/347 AD; 340/347 M
[58] Field of Search .... 340/347 M, 347 SY, 347 AD; 318/654–661, 569

[56] References Cited

U.S. PATENT DOCUMENTS 3,735,391  5/1973  Games et al. ................. 340/347 SY
3,898,648  8/1975  Gariazzo ....................... 340/347 SY Primary Examiner—T. J. Sloyan
Attorney, Agent, or Firm—Dominic J. Chiantera

[57] ABSTRACT

A synchro signal-to-digital signal converter for providing a digital signal representation of synchro angle value in response to sensed synchro signals representative of actual synchro stator voltage signals and actual synchro rotor voltage signals, includes an analog signal interface responsive to the sensed synchro signals for providing a digital signal representative of the ratio of the smaller of the difference signal magnitudes between each of two stator winding voltage signals and a third stator winding voltage signal selected as a reference, divided by the larger, and for providing discrete signal manifestations of the particular one of a plurality of successive ranges of synchro angle values associated with the sensed synchro signals received, the synchro to digital signal converter further including a signal processor responsive to the digital ratio signal and to the discrete signal manifestations of synchro angle range, for providing a signal representation of actual synchro angle value associated with the sensed synchro signal data received.

2 Claims, 4 Drawing Figures

FIG. 4

| DISCRETE STATES | | | SYNCHRO ANGLE α = |
|---|---|---|---|
| Mxz | ϕxy | ϕzy | |
| 0 | 0 | 0 | $150° + TAN^{-1}\left[\frac{1-2 \cdot R}{\sqrt{3}}\right]$ |
| 0 | 0 | 1 | $330° + TAN^{-1}\left[\frac{1+2 \cdot R}{\sqrt{3}}\right]$ |
| 0 | 1 | 0 | $150° + TAN^{-1}\left[\frac{1+2 \cdot R}{\sqrt{3}}\right]$ |
| 0 | 1 | 1 | $330° + TAN^{-1}\left[\frac{1-2 \cdot R}{\sqrt{3}}\right]$ |
| 1 | 0 | 0 | $90° - TAN^{-1}\left[\frac{1-2 \cdot R}{\sqrt{3}}\right]$ |
| 1 | 0 | 1 | $90° - TAN^{-1}\left[\frac{1+2 \cdot R}{\sqrt{3}}\right]$ |
| 1 | 1 | 0 | $270° - TAN^{-1}\left[\frac{1+2 \cdot R}{\sqrt{3}}\right]$ |
| 1 | 1 | 1 | $270° - TAN^{-1}\left[\frac{1-2 \cdot R}{\sqrt{3}}\right]$ | ns
AC SYNCHRO SIGNAL TO DIGITAL SIGNAL CONVERTER

This is a division of application Ser. No. 158,860 filed on June 12, 1980, now U.S. Pat. No. 4,340,881.

TECHNICAL FIELD

This invention relates to analog signal conditioning interfaces, and more particularly to converting AC synchro analog signal information into a selected, processor compatible digital signal format.

BACKGROUND ART

One example of prior art analog signal interfaces is that with the signal inputs from the AC synchros which sense the actual angular position of various control surfaces on the aircraft, such as flaps, ailerons, rudder, etc. In contrast to the other types of input signals the synchro angle information resides contemporaneously in the relative magnitude and phasing between the line-to-line synchro stator voltages. As known, the rotor winding of each synchro sensor is energized with a known magnitude, reference AC voltage signal. The amplitude of the voltage signals induced in each of the synchro stator windings is dependent on the turns ratio between rotor and stator and on the synchro angle ($\alpha$); by comparing the amplitude and relative phase of the voltages induced in each of two stator windings the value of $\alpha$ is uniquely determined.

In the prior art synchro signal interfaces the stator winding voltages ($V_X$, $V_Y$, $V_Z$) are compared to provide two differential signals representative of the difference voltage between each of two stator windings with respect to the third stator winding selected as a reference. The differential synchro signals are sinusoids at the same frequency as the reference AC rotor signal, but with an amplitude which is modulated in dependence on the value of the synchro angle $\alpha$. The pair of differential signals are converted by a precision Scott T network into a pair of output voltage signals whose amplitudes are proportional to the sine and cosine of the synchro angle value. As known, the Scott T network includes a pair of precision, cross coupled closed loop operational amplifiers, each of which provides one of the pair of output voltage signals. The sine and cosine signals are then processed in any one of a number of known methods to extract the relative magnitude and relative phasing information which defines the synchro angle value. One method includes phase shifting the sine and cosine signals by known, opposite phase shift values. The difference magnitude between the two phase shifted signals is representative of the synchro angle value, and is obtained by converting the phase shifted signal to a pulse width modulated (PWM) signal with a duty cycle in dependence on the difference signal magnitude. The PWM signal is converted into a digital word by counting the number of known frequency clock pulses within the ON portion of the PWM signal. The total count value is directly proportional to synchro angle value and may be read directly as a digital word to the DAU signal processor. An alternative method is to ratio the sine and cosine signals into a tangent or cotangent equivalent, which is converted to a digital signal equivalent and transformed by the DAU signal processor into the Arc function to generate the synchro angle value.

The prior art use of the Scott T circuitry, in addition to the downstream precision circuitry required to accurately preserve the magnitude and phase information in the two output signals, not only represents an additional dedicated interface within the overall analog interface, but a costly one at that. The circuitry is unique to the conditioning of the input synchro signal alone and has no applied use in the signal conditioning or conversion of any of the other types of analog input information. The present generation of digital flight data acquistion units (DFDAU) as defined by ARINC-717 requires a universal type signal conditioning interface which can accommodate all of the various types of input signal formats without the use of dedicated input channels. As such, any channel input must be capable of accepting any input signal format, i.e. DC, AC ratio, three wire resistance probes and synchros.

DISCLOSURE OF INVENTION

One object of the present invention is to provide a synchro signal-to-digital signal converter which eliminates the use of a Scott T network. Another object of the present invention is to provide a synchro signal-to-digital signal converter having zero synchro angle ambiguity.

According to the present invention, a synchro signal-to-digital signal converter for providing a digital signal representation of synchro angle value in response to sensed synchro signals representative of actual synchro stator voltage signals and actual synchro rotor voltage signals, includes an analog signal interface responsive to the sensed synchro signals for providing a digital signal representative of the ratio of the smaller of the difference signal magnitudes between each of two stator winding voltage signals and a third stator winding voltage signal selected as a reference, divided by the larger, and for providing discrete signal manifestations of the particular one of a plurality of successive ranges of synchro angle values associated with the sensed synchro signals received, the synchro to digital signal converter further including a signal processor responsive to the digital ratio signal and to the discrete signal manifestations of synchro angle range, for providing a signal representation of actual synchro angle value associated with the sensed synchro signal data received. In still further accord with the present invention, the signal processor includes a memory for storing a plurality of identification signals, each identifying synchro angle value in terms of digital ratio signal value in an associated one of the plurality of successive ranges of synchro angle values defined by the discrete signal manifestations, the processor providing the signal representation of actual synchro angle value as that identified in dependence on the digital ratio signal value by the particular one of the plurality of identification signals selected in dependence on the discrete signal manifestations. In still further accord with the present invention the discrete signal manifestations include a magnitude discrete signal for identifying each change in relative magnitude of the two difference signal magnitudes, and include two phase discrete signals for identifying the changes in relative phase of each of the difference signal magnitudes with respect to the actual synchro rotor voltage, the plurality of successive ranges of synchro angle values are each defined as the intervals within the total range of synchro angle value bounded by successive changes in magnitude and phase as indicated by the discrete signal manifestations.

3

These and other objects, features and advantages of the present invention will become more apparent in light of the detailed description of a best mode embodiment thereof, as illustrated in the accompanying drawing.

BRIEF DESCRIPTION OF DRAWING(S)

Figure 1:
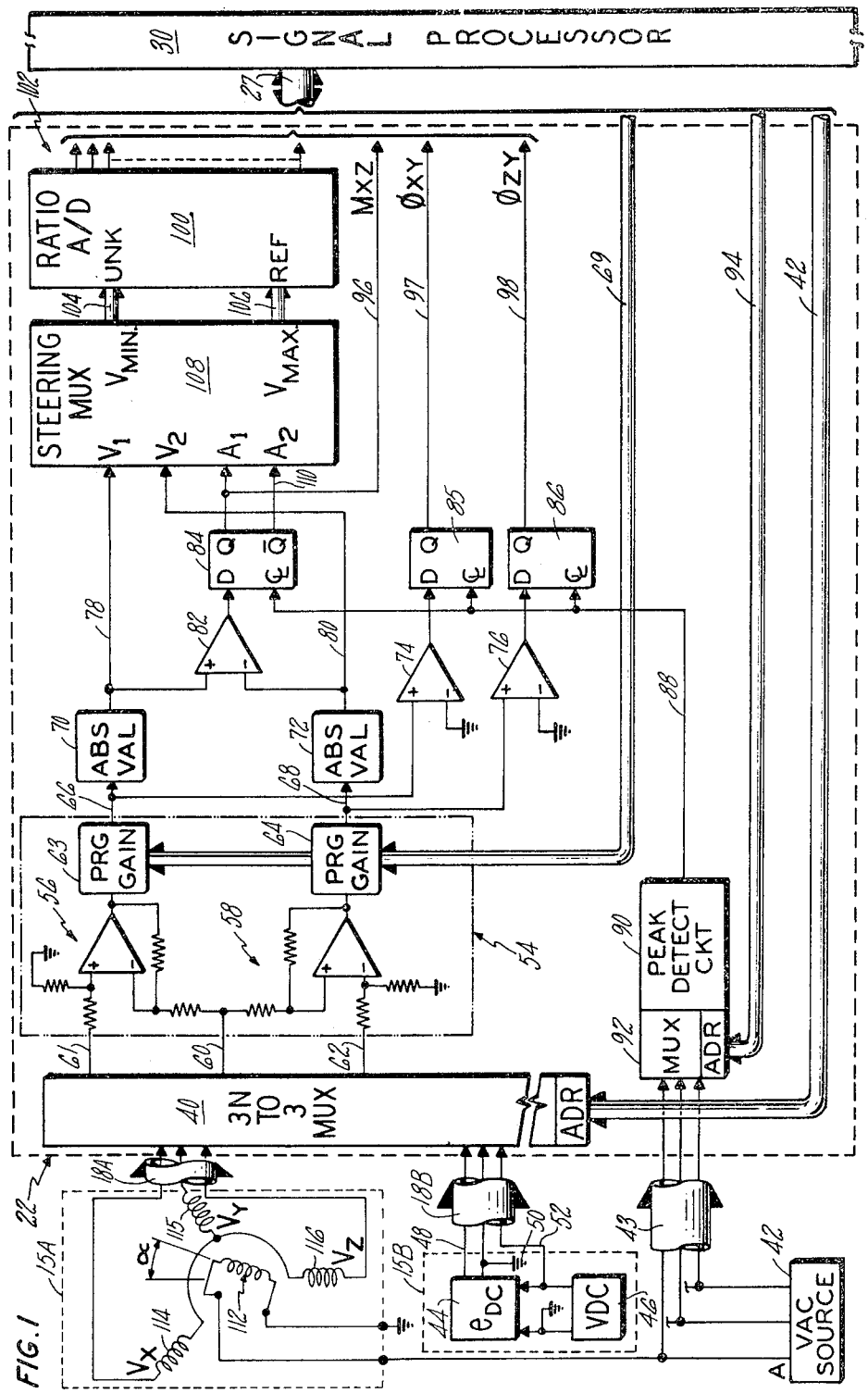
FIG. 1 is a system block diagram illustration of a best mode embodiment of an analog signal conditioning interface according to the present invention.
Figure 2:
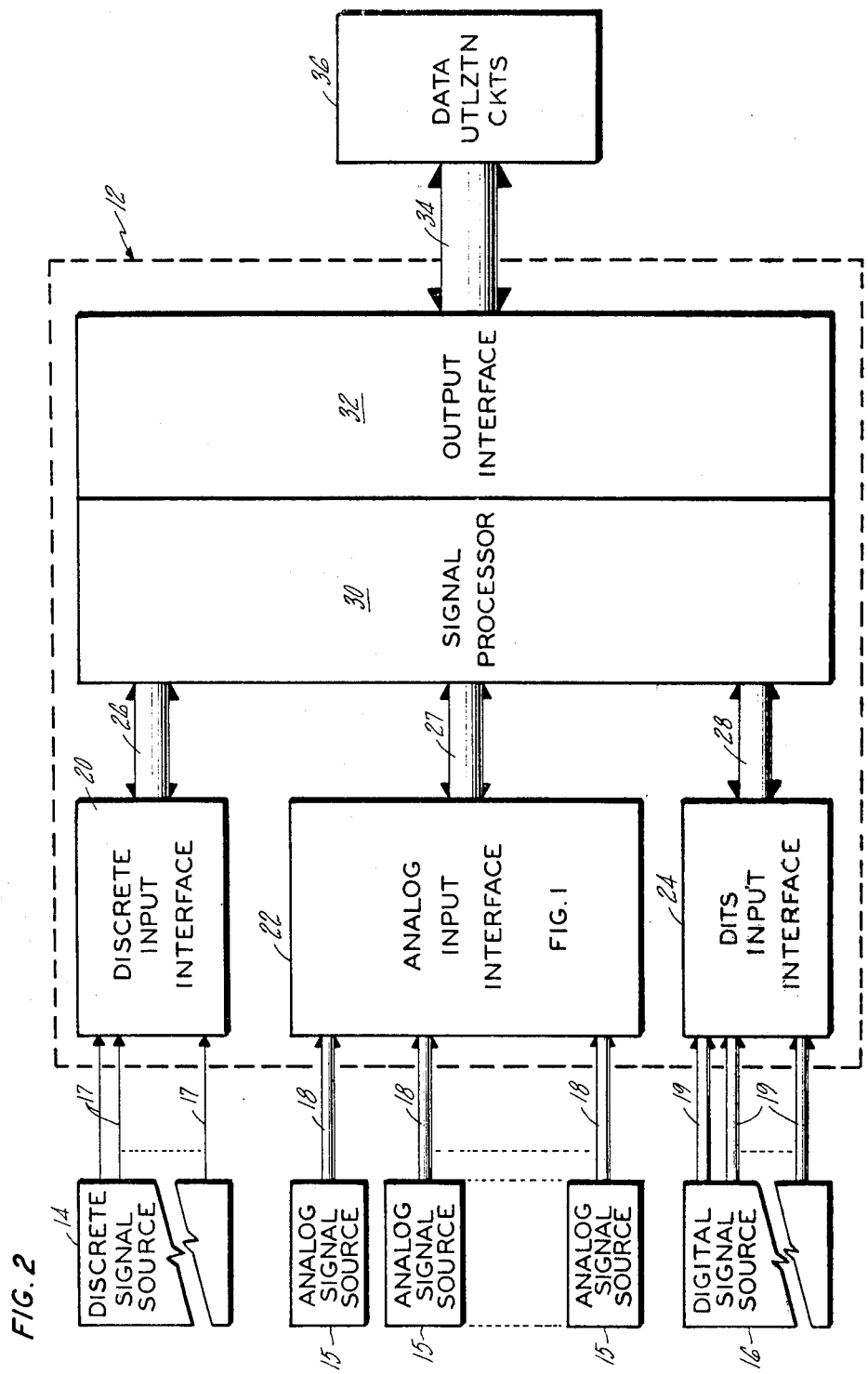
FIG. 2 is a simplified, system block diagram illustration of a data acquisition system utilizing the signal conditioning interface of FIG. 1.
Figure 3:
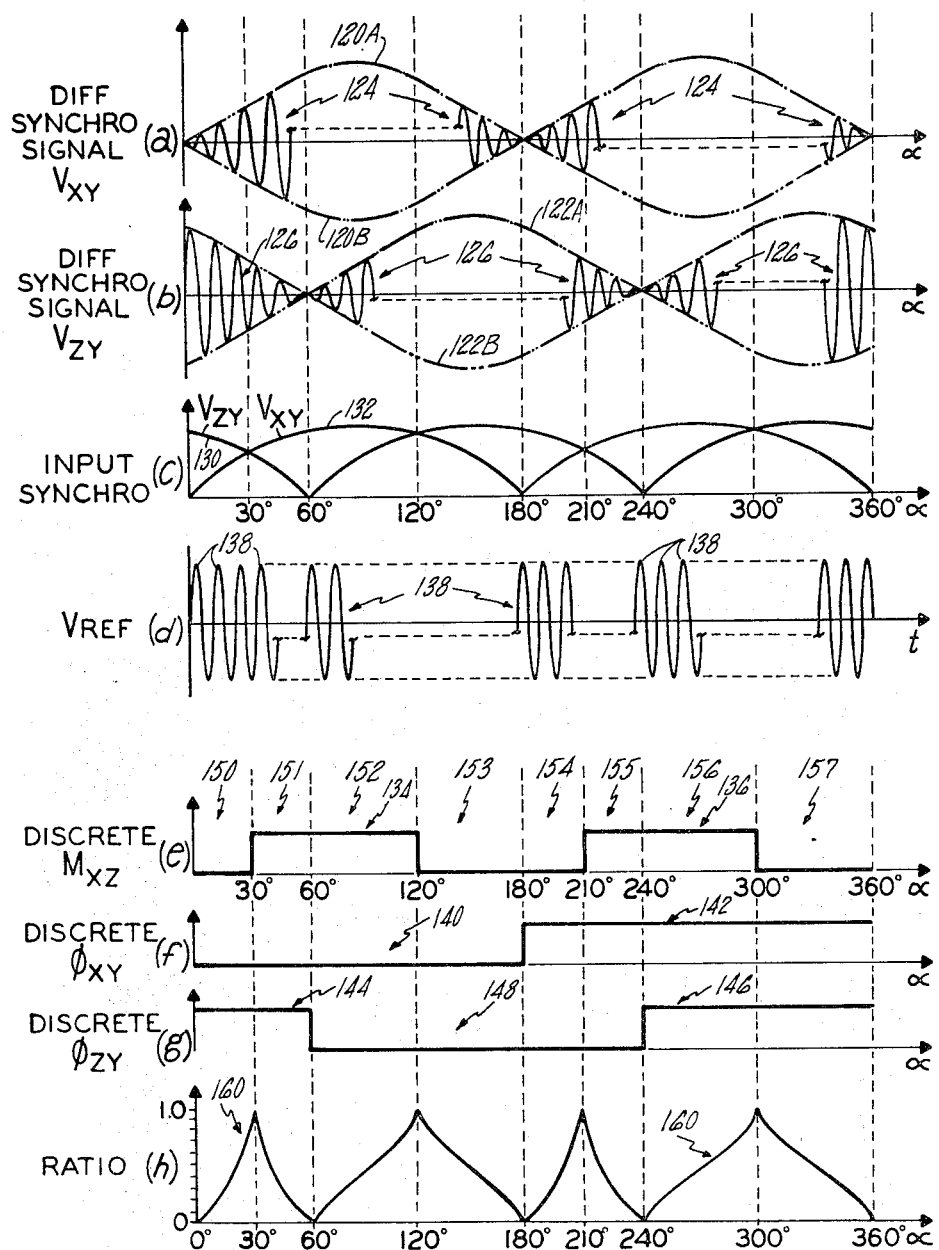

FIG. 3 is an illustration of various signal waveforms used in the description of the operation of the signal conditioning interface of FIG. 1 in providing synchro signal to digital signal conversion; and FIG. 4 is a tabulation of the operational parameters used by the signal conditioning interface of FIG. 1 in providing synchro signal to digital signal conversion in the data acquisition system of FIG. 2.

BEST MODE FOR CARRYING OUT THE INVENTION

Referring first to FIG. 2, a typical data acquisition unit (DAU) 12 receives input signal information from a plurality of different type signal sources, including: discrete signal sources 14, analog sources 15, and digital signal sources 16. The sources provide the various format input signals defined by ARINC-717 and present the input signals on lines 17-19 to the DAU. The signals are received within the DAU at a discrete signal interface 20, an analog signal interface 22, and a digital signal interface 24, each of which convert the received signals into a digital signal format which is presented through lines 26-28 to the DAU signal processor 30. The processor organizes the data and presents it through an output interface 32 and output lines 34 to the data utilization circuits 36.

The analog signal conditioning interface 22 includes a common signal conditioner/converter for use with each of the various types of analog input signal formats specified by ARINC-717. These include the sensed synchro signal data from the aircraft's AC synchro sensors. The sensed synchro signal inputs are processed without the use of a Scott T network by converting the magnitude information from the sensed synchro stator voltages into ratiometric values and by converting relative phase information into signal bit discretes; all of which are read and processed by the DAU signal processer 30 to determine synchro angle value.

Referring now to FIG. 1, an analog signal conditioning interface 22 includes an input multiplexer (MUX) 40 with a standard three wire input capable of accepting all of the various combinations of multiwire inputs defined by the ARINC-717 specification. The MUX is a 3N-to-3 type, were N is the total number of analog signal inputs and is under address control by the DAU signal processor 30 which provides the address signals to the MUX through lines 41.

Only two types of input analog sources are shown in FIG. 1; an AC synchro sensor 15A and a DC sensor 15B. An interface data clock signal is derived from the aircraft three phase VAC source 42 which is presented to the interface through separate input lines 43. The synchro sensor is a nominal three wire input.

The three wire signal inputs are addressed sequentially by the MUX 40 and presented one at a time in successive sample time intervals to the input of a differential receiver 54 which includes a pair of closed loop, operational amplifiers 56, 58. The inverting input of each of the amplifiers 56, 58 are connected to a common output line 60 from the MUX and the non-inverting inputs are each connected to an associated one of the remaining two output lines 61, 62. As such, the receiver 54 includes a three wire input with the two wire inputs to each amplifier sharing a common input line. The amplifiers themselves are high gain operational amplifiers of a known type, such as the National Semiconducter LM148 which function as input buffers, or voltage followers, and are provided with a typical closed loop gain of unity. Each of the amplifiers provide a differential output signal indicative of the difference magnitude between the input signals received at the two input lines of each amplifier. In the best mode embodiment of FIG. 1, the receiver 54 also includes a pair of programmable gain amplifiers 63, 64, each responsive to the differential output signal from an associated one of the amplifiers. These programmable amplifiers are typically discrete stages which include an operational amplifier, such as the LM108A, strapped down with a plurality of selectable, switch actuated feedback paths. The purpose of the programmable gain amplifiers is to accommodate the range of signal amplitudes among the various types of input signals to the interface. The differential signals on the output lines 66, 68 of the receiver are presented to the input of an associated one of a pair of absolute value circuits 70, 72 and to an associated one of a pair of phase comparators 74, 76.

The absolute value circuits are precision full wave rectifiers of a known type which typically include dual operational amplifiers, and which do not include DC filtering. Filtering is not required since, as described hereinafter, the full wave rectified output signals from each circuit are combined in a ratiometric manner. The phase comparators 74, 76 are similarly of a known type, such as the National Semiconducter LM139 Quad Comparator Chip. Each of the phase comparators receive the associated output differential signal from the receiver 54 at the non-inverting input of each; the inverting input of each phase comparator is connected to signal ground.

The full wave rectified signals from the absolute value circuits 70, 72 are presented on lines 78, 80 to the non-inverting and inverting inputs, respectively, of a comparator 82, which may be identical to the comparators 74, 76. The outputs from each of the comparators 74, 76, 82 are connected to the signal input of an associated one of three bi-stable latches 84–86. The latches are also of a type known in art, such as D edge-triggered flip-flops. Each of the latches are triggered by a clock signal presented on a line 88 from a peak detect circuit 90 which detects the successive peak positive values of a selected one of the three phases of the aircraft VAC source 42. The particular phase is selected by an input MUX 92 under address control by the signal processor 30 through lines 94. Typically, the phase selected is that one of the three phases of the VAC source providing the excitation to the particular one of the input sources providing a present input signal. The output from the peak detect circuit 90 is a pulse train with a pulse repetition frequency equal to the source excitation frequency, which in turn defines the sample time interval for the DAU.

The true (Q) outputs from each of the latches 84–86 are presented through the lines 96–98 to the output of the analog interface, and through lines 27 to the signal processor 30. The true output from the latch 84 is the "magnitude" discrete $M_{XZ}$ which provides an indication of the relative magnitude of the two differential signals at the output of the receiver 54, on the lines 66, 68. With the comparator 82 connected as shown the magnitude discrete is set at a logic one state in response to the absolute value signal on the line 78 being greater than that on the line 80, and is set to a logic zero state for the opposite condition. The true outputs from the latches 85, 86 are "phase" discrete signals $_{XY}$, $_{ZY}$, each providing an indication of the relative phasing between the differential signals provided by the receiver 54, i.e. mutually in phase, or out of phase. As described hereinafter the phase discretes are used primarily in the processing of the sensed synchro data.

The actual value of the sensed input signal data is provided as a ratio of the smaller of the two absolute value signals on the lines 78, 80 divided by the larger. In the case of an absolute sensed signal i.e. the source 15B, this results in the absolute value signal being provided as the numerator and the larger magnitude, source excitation signal being included as the denominator. For the true ratiometric sensed input signals, the smaller value is always the numerator. As a result the ratio magnitude is always equal to, or less than unity.

The ratio signal is provided in the signal conversion circuitry of the interface, which includes a ratiometric analog-to-digital (A/D) converter 100 for providing a multiple bit digital signal representation of the ratio magnitude on the interface output lines 102 included with the discrete signal lines 96-98 in the lines 27 to the processor. The A/D is of a type known in the art, such as a triple ramp, integrating ratiometric type, which provides the output digital signal as the ratio of the signal magnitude presented on lines 104 to the UNKNOWN input divided by the signal magnitude presented on lines 106 to the REFERENCE input of the A/D. Since the relative magnitudes of the absolute value signals alternate with different sensed signal inputs, a "steering" MUX 108 in combination with the latch 84 determines the smaller/larger values of absolute values and steers them to the appropriate input of the A/D. The steering MUX is similarly of a known type, such as the Harris Model HI-201 CMOS switch, which is connected at two signal magnitude inputs $V_1$, $V_2$ to the outputs of the absolute value circuits on lines 78, 80, and which is connected at a steering address input $A_1$, $A_2$ to the true and $\overline{true}$ outputs of the latch 84. In operation, with the connection of the comparator 82 as shown in FIG. 1, a line 78 value greater than that on line 80 results in a steering input signal state of $A_1=1$, $A_2=0$ causing the MUX to switch the line 78 signal to the REFERENCE input and the line 80 signal to the UNKNOWN input. This corresponds to a logic one state for the magnitude discrete on line 96. For the opposite condition, the steering signal state $A_1=0$, $A_2=1$ results in lines 78, 80 connected to the UNKNOWN and REFERENCE input respectively, with the magnitude discrete at a logic zero.

In the processor, the ratio signal magnitude is compared with the scale, or range of anticipated ratio values associated with each particular parameter, all of which is defined in software to the processor. The ratio format provides highly accurate sensing of the true parameter value since it compensates for variations in the absolute value due to excitation source variations. This is true in both absolute sensed parameter input signals and in ratiometer inputs where the signals to be ratioed are derived from a common source. The use of the phase discrete signals on lines 97, 98 is associated with those particular input signals, such as the AC synchro input, where sensed phase information is required. When not needed the phase discrete signals are simply not read by the processor, otherwise the phase discretes are read together with the magnitude discrete and the digital ratio signal as part of the total word read out to the signal processor collectively through lines 27.

In the operation of the interface 22 in combination with the signal processor 30 to provide actual synchro angle values in response to input sensed synchro data representative of the actual synchro stator voltages and the actual rotor excitation, the interface provides the synchro signal to digital signal conversion in the same ratio format together with the magnitude and phase discretes described hereinbefore. This eliminates the Scott T network and, with the exception of precision absolute value circuits, the precision circuitry required to process the Scott T output signals. The synchro sensor 15A of FIG. 1 illustrates a typical synchro sensor configuration. The rotor 112 which rotates in agreement with the particular rotational element whose angular position is to be sensed is energized with one phase of the AC power bus; in FIG. 1 it is assumed that the rotor is energized by phase A which is then defined as the synchro reference ($V_{REF}$). The rotor winding voltage is defined as: $V_{REF}=V\text{SIN }\omega t$, where V is the peak value AC voltage magnitude and $\omega t$ is the frequency (typical 400 Hz). The voltage signals ($V_X$, $V_Y$, $V_Z$) induced in the three stator winding 114-116 are defined as:

$V_x=\eta \cdot V_{REF}\cdot\text{Cos}(\alpha+120°)$ $V_y=\eta\cdot V_{REF}\cdot\text{Cos}(\alpha-120°)$; , $V_z=\eta\cdot V_{REF}\cdot\text{Cos}\alpha$ and are presented through lines 18A to the MUX 40. In FIG. 1 it is assumed that the synchro stator voltage signal $V_Y$ is presented through line 60 to the differential receiver 54 and the stator voltage signals $V_X$, $V_Z$ are presented on lines 62, 64. In other words $V_Y$ is common to both amplifiers 56, 58, resulting in the input differential voltages $V_X-V_Y$ and $V_Z-V_Y$, respectively.

The output differential signals from the receiver on the lines 66, 68 are equal to: $V_{XY}=V_X-V_Y=K_T V_{REF}(-\text{SIN}\alpha)$ and $V_{ZY}=V_Z-V_Y=K_T V_{REF}\text{SIN}(\alpha+120°)$ where $K_T=\eta\cdot\sqrt{3}$. In FIG. 3, illustrations (a), (b) depict the modulated amplitude of the two differential signals $V_{XY}$, $V_{ZY}$ over the 0° to 360° range of synchro angle ($\alpha$) values. The phantom wave form envelopes 120A, 120B and 122A, 122B represent the locus of peak positive and negative values of the modulated AC waveforms 124, 126 for the differential signals $V_{XY}$ and $V_{ZY}$ respectively. Illustration (d) shows the rotor $V_{REF}$ waveform 128. Comparison of the differential signal waveforms 124, 126 with the $V_{REF}$ waveform 128 indicates the change in phase of each differential signal over the synchro angle range. The differential signal $V_{XY}$, which is proportional to $-\text{Sin }\alpha$, is 180° out of phase with the $V_{REF}$ for synchro angle values between 0° and 180° and is in phase between 180° and 360°. The differential signal $V_{ZY}$ which is proportional to $\text{Sin}(\alpha+120°)$ is in phase with $V_{REF}$ for synchro angle values between 0° to 60° and 240° to 360°, and 180° out of phase between 60° and 240°.

The differential signals are presented to the absolute value networks 70, 72 which provide on the output lines 78, 80 the full wave rectified DC equivalent of the modulated differential AC signals. In FIG. 3, illustration (c)

the envelope i.e. the locus of peak positive values of the absolute value signals on the lines 78, 80 is illustrated by waveform 130 for the absolute value equivalent of $V_{ZY}$, and the waveform 132 for the absolute value of $V_{XY}$, each illustrating the change in amplitude of the differential signals with respect to synchro angle. As shown in illustration (c) the magnitude of differential signal $V_{ZY}$ (line 80) is greater than that of $V_{XY}$ for the initial range of synchro angle values between 0° and 30°. The crossover at 30° results in $V_{XY}$ being greater than $V_{ZY}$ over the succeeding interval between 30° and 120°, and the relative magnitudes of the two absolute value signals alternate over the range of synchro angle values, with crossover occurring at 30°, 120°, 210°, and 300°. Each of these crossover points results in a change in the state of the magnitude discrete signal $M_{XZ}$ on the line 96. Similarly the change in phase of each of the differential signals in illustrations (a) and (b) are detected by comparators 74, 76 and the latches 85, 86 establish the binary state of the phase discrete signals $x_Y$, $z_Y$ on the lines 97, 98. As such the signal processor obtains magnitude and phase crossover manifestations for each of the differential signals over the full range of synchro angle values.

In FIG. 3, illustrations (e) through (g) indicate the binary state of the magnitude discrete signal $M_{XZ}$ and the two phase discrete signals $x_Y$, $z_Y$ on the lines 96-98 to the processor 30. The discrete $M_{XZ}$ transitions at each of the magnitude crossover points; $M_{XZ}$ is at a logic one for synchro angle values in the range of 30° to 120° and 210° to 300°, i.e. those intervals in which as shown in (c) the absolute value of $V_{XY}$ is greater than $V_{ZY}$, and is at a logic zero state at all other times. Similarly, for the phase discrete signals, each latch is clocked at each positive peak value of $V_{REF}$ such that discrete $x_Y$ is at a logic zero (140) for the range of synchro angle values between 0° and 180° and at a logic one (142) between 180° and 360°. In the same manner $V_{ZY}$ is in phase with $V_{REF}$ for synchro angle values in the range of from 0° to 60° and from 240° to 360°, and is out of phase at all other values. The phase discrete $z_Y$ manifests this with logic one states (144), (146) over the corresponding in phase portions and a logic zero (148) for the remaining portion. The combined total number of transitions in both magnitude and phase of the differential signals over the full 360° range of synchro values define eight intervals, or sub-ranges of synchro angle values; this results from four transitions of the discrete $M_{XZ}$, one transition for the discrete $x_Y$, and the two transitions for the discrete $z_Y$. Each interval is uniquely defined by the combined logic states of the three discretes which provide a three bit signal indication which at any given time defines the particular one of the eight intervals 150-157 identified by the sensed synchro data. In the first interval 150 for $0° \leq \alpha \leq 30°$ the three bit signal resulting from the combined discretes $M_{XZ}$, $x_Y$, $z_Y$ (reading from top to bottom in illustration (e)-(g)) is 0,0,1. For the second interval 152 the three discretes define a three bit 1,0,1, and so on through the entire 360° range of synchro values. Table I illustrates the discrete signal states versus sub-ranges of synchro angle values.

TABLE I

| $M_{XZ}$ | $\phi_{XY}$ | $\phi_{ZY}$ | α |
|---|---|---|---|
| 0 | 0 | 1 | 0°–30° |
| 1 | 0 | 1 | 30°–60° |
| 1 | 0 | 0 | 60°–120° |
| 0 | 0 | 0 | 120°–180° |

TABLE I-continued

| $M_{XZ}$ | $\phi_{XY}$ | $\phi_{ZY}$ | α |
|---|---|---|---|
| 0 | 1 | 0 | 180°–210° |
| 1 | 1 | 0 | 210°–240° |
| 1 | 1 | 1 | 240°–300° |
| 0 | 1 | 1 | 300°–360° |

With the eight intervals or sub-ranges uniquely defined by the combination of the three discrete signals, each digital ratio signal from the A/D 100 may be identified as associated with a particular one of the eight sub-ranges. The processor 30 recognizes the sub-range defined by the three discrete signals. The actual synchro angle value α corresponding to each ratio signal magnitude within a defined one of the sub-ranges may then be determined through the use of trigonometric identities derived for each sub-range. The tabulation of FIG. 4 lists the trigonometric expression associated with each sub-range defined by the three bit combination of the three discrete signals. In the embodiment of FIG. 1, the trigonometric expressions are provided in terms of the Arc Tangent of the synchro angle α, however, any other equivalent trigonometric function may be used. Each expression is valid for the values of synchro angle within the particular sub-range and each defines the synchro angle in terms of the ratio signal magnitude (R). The derivation of the trigonometric expressions associated with each sub-range is listed in Appendix A, and as indicated each of the eight expressions are derived directly from the equations for the synchro differential signals appearing on lines 66, 68.

To illustrate the operation of the interface as a synchro to digital signal converter, assume at one sample time interval that the sensed input synchro data results in the output discrete signals $M_{XZ}$, $x_Y$, $z_Y$ on the lines 96-98 identifying a 1,0,1 state, and the digital ratio signal on the lines 102 representing a 0.532 value. The interval defined by the discretes in FIG. 4 defines the synchro angle as:

$$\alpha = 90° - \mathrm{Tan}^{-1}\left(\frac{1 + 2 \cdot R}{\sqrt{3}}\right).$$

For the ratio value R=0.532 the expression reduces to: $\alpha = 90° - \mathrm{Tan}^{-1}(1.1917)$, or $\alpha = 40°$. In FIG. 3, illustration (h) the waveform 160 represents the locus of ratio signal magnitudes over the 360° range of synchro angle values. The waveform 160 is non-linear in each sub-range due to the characteristics of the tangent function, and the ratio magnitudes are all in the range of 0 to 1.0.

As stated before, the ratio format allows for cancellation of the common tolerances associated with the stator windings, i.e. source excitation, to provide for a more accurate determination of synchro angle value. The use of the analog interface as a synchro to digital converter also provides for the continuous ability to determine synchro angle. This results from the definition of the sub-range intervals by the discrete signals. Each interval defines a range of values spanning a maximum delta of 60° whereby the associated trigonometric equation avoids the discontinuous segments of the Arc Tangent function. This ensures zero synchro angle ambiguity. In addition, the synchro conversion function is also insensitive to the transitional state of synchro angle values between adjacent intervals; the present invention providing a continuous transition in synchro angle value between each of these adjacent intervals.

The operation of the universal signal conditioner as a synchro signal to digital signal converter, eliminates the use of the precision Scott T circuitry. Instead, the synchro stator voltages are converted to differential stator voltages signals which are ratioed to provide a ratio magnitude value which, in combination with the three discrete signals relating to magnitude and relative phase of the differential signals, provides definition of the synchro angle value throughout the total synchro angle range of values (0°–360°). In the ratio signal, the larger of the two input signals is always provided as the denominator of the ratio thereby ensuring a ratio equal to, or less than unity.

Similarly, although the invention has been shown and described with respect to a best mode embodiment thereof, it should be understood by those skilled in the art that various other changes, omissions, and additions may be made thereto without departing from the spirit and the scope of this invention.

APPENDIX A

SYNCHRO DIFFERENTIAL SIGNALS:

(1) $V_{XY} = V_X - V_Y = K_T \cdot V_{REF} \cdot (-\sin\alpha)$; and (2) $V_{ZY} = V_Z - V_Y = K_T \cdot V_{REF} \sin(\alpha + 120°)$;

where $K_T = \eta \cdot \sqrt{3}$ and $V_{REF} = V \sin \omega t o$

DEFINE DISCRETE SIGNALS $M_{XZ}$, $\phi_{XY}$, and $\phi_{ZY}$ as follows:

(3A) $M_{XZ} = 1$, for $|V_{XY}| > |V_{ZY}|$;
(3B) $M_{XZ} = 0$, for $|V_{XY}| < |V_{ZY}|$;
(4A) $\phi_{XY} = 1$, for $V_{XY}$ in phase with $V_{REF}$;
(4B) $\phi_{XY} = 0$, for $V_{XY}$ out of phase with $V_{REF}$;
(5A) $\phi_{ZY} = 1$, for $V_{ZY}$ in phase with $V_{REF}$; and
(5B) $\phi_{ZY} = 0$, for $V_{ZY}$ out of phase with $V_{REF}$.

DEFINE RATIO SIGNAL R AS FOLLOWS:

(6A) $S \cdot R = S \left| \dfrac{V_{ZY}}{V_{XY}} \right|$; for $M_{XZ} = 1$ and (6B) $S \cdot R = S \left| \dfrac{V_{XY}}{V_{ZY}} \right|$; for $M_{XZ} = 0$, where:
(6C) $S = +1$; for $\phi_{XY} = \phi_{ZY}$ and
(6D) $S = -1$; for $\phi_{XY} \neq \phi_{ZY}$.

SUBSTITUTING EQ's (1), (2) into EQ (6A):

(7A) $S \cdot R = S \left| \dfrac{\sin(\alpha + 120°)}{-\sin\alpha} \right| =$ $S \left| \dfrac{1}{2} - \dfrac{\sqrt{3}}{2} \cot\alpha \right|$, THEREFORE (7B) $\cot\alpha = \dfrac{1 - 2 \cdot S \cdot R}{\sqrt{3}}$.

SOLVING FOR $\alpha$ IN TERMS OF THE ARC Tan:

(8) $\alpha = 90° - \tan^{-1}\left[ \dfrac{1 - 2 \cdot S \cdot R}{\sqrt{3}} \right]$;

$30° \leq \alpha \leq 120°$, and

APPENDIX A-continued (9) $\alpha = 270° - \tan^{-1}\left[ \dfrac{1 - 2 \cdot S \cdot R}{\sqrt{3}} \right]$;

$210° \leq \alpha \leq 300°$.

SINCE $S = -1$ for $30° \leq \alpha \leq 60°$ and $210° \leq \alpha \leq 240°$:

(10) $\alpha = 90° - \tan^{-1}\left[ \dfrac{1 + 2 \cdot R}{\sqrt{3}} \right]$;

$30° \leq \alpha \leq 60°$,

(11) $\alpha = 90° - \tan^{-1}\left[ \dfrac{1 - 2 \cdot R}{\sqrt{3}} \right]$;

$60° \leq \alpha \leq 120°$,

(12) $\alpha = 270° - \tan^{-1}\left[ \dfrac{1 + 2 \cdot R}{\sqrt{3}} \right]$;

$210 \leq \alpha \leq 240°$, and

(13) $\alpha = 270° - \tan^{-1}\left[ \dfrac{1 + 2 \cdot R}{\sqrt{3}} \right]$;

$240° \leq \alpha \leq 300°$

SUBSTITUTING EQ's (1), (2) INTO EQ (6B):

(14A) $S \cdot R = S \left| \dfrac{-\sin\alpha}{\sin(\alpha + 120°)} \right|$

SUBSTITUTING $\theta = \alpha + 120°$:

(14B) $S \cdot R = S \left| \dfrac{-\sin(\theta - 120°)}{\sin\theta} \right| =$ $S \left| \dfrac{1}{2} + \dfrac{\sqrt{3}}{2} \cot\theta \right|$, THEREFORE (14C) $\cot\theta = \dfrac{1 - 2 \cdot S \cdot R}{\sqrt{3}}$.

RESUBSTITUTING $\theta = \alpha + 120°$ AND SOLVING FOR $\alpha$ IN TERMS OF THE ARC Tan:

(15) $\alpha = 330° + \tan^{-1}\left[ \dfrac{1 - 2 \cdot S \cdot R}{\sqrt{3}} \right]$;

$300° \leq \alpha \leq 30°$, and

(16) $\alpha = 150° + \tan^{-1}\left[ \dfrac{1 - 2 \cdot S \cdot R}{\sqrt{3}} \right]$;

$120° \leq \alpha \leq 210°$.

SINCE $S = -1$ FOR $0 \leq \alpha \leq 30°$ AND $180° \leq \alpha \leq 210°$:

(17) $\alpha = 330° + \tan^{-1}\left[ \dfrac{1 - 2 \cdot R}{\sqrt{3}} \right]$;

$300° \leq \alpha \leq 360°$,

(18) $\alpha = 330° + \tan^{-1}\left[ \dfrac{1 + 2 \cdot R}{\sqrt{3}} \right]$;

$0° \leq \alpha \leq 30°$,

APPENDIX A-continued

(19)
$$\alpha = 150° + \text{Tan}^{-1}\left[\frac{1 - 2 \cdot R}{\sqrt{3}}\right];$$

$120° \leq \alpha \leq 180°$, and

(20)
$$\alpha = 150° + \text{Tan}^{-1}\left[\frac{1 + 2 \cdot R}{\sqrt{3}}\right];$$

$180° \leq \alpha \leq 210°.$

We claim:

1. An AC synchro-to-digital converter for providing synchro angle values from received sensed signals representative of the actual voltage magnitudes of each of the three AC synchro stator windings and the rotor winding, comprising:

analog-to-digital (A/D) signal interface, including differential amplifier means responsive to the actual stator winding voltage signals for providing difference stator winding signals representative of the difference voltage magnitude between a selected one of the stator windings and each of the remaining two, absolute value circuit means responsive to said difference stator winding signals for providing absolute value signals representative of each, and peak signal detection means responsive to the actual rotor winding voltage signal for providing a reference pulse signal in the presence of each of a selected polarity rotor peak voltage signal value, said A/D interface further including signal conversion means responsive to said difference stator winding signals, said absolute value signals, and said reference pulse signals, for providing in the presence of each reference pulse signal, a digital ratio signal representing the magnitude ratio of the smaller magnitude difference stator winding signal divided by the larger magnitude difference stator winding signal, digital difference magnitude signals representing each of said difference stator winding signal magnitudes, and digital phase signals representing the relative phase between each of said remaining stator winding sensed voltage signals and the sensed rotor voltage signal; and signal processing means, responsive to said digital ratio signal, said digital phase signals, and said digital difference magnitude signals, and including memory means for storing a plurality of identification signals associated with different sub-ranges of synchro angle values within a total range of synchro travel, each identification signal defined as a combination of said digital difference magnitude signal and said digital phase signal value and each identifying a particular synchro angle value within its associated sub-range in combination with said digital ratio signal value, said processing means providing actual synchro angle values in dependence on the value of said digital ratio signal in the presence of a particular sub-range defined by said digital difference magnitude and said digital phase signal values.

2. The invention of claim 1, wherein said signal conversion means, comprises:

magnitude comparator means responsive to said absolute value signals for providing a magnitude discrete signal indicative of their relative magnitude;

phase comparator means responsive to each of said difference stator winding signals and to a common reference phase signal presented thereto, for providing phase discrete signals indicative of the phase relationship therebetween;

plurality of bistable switch means associated with said magnitude comparator means and said phase comparator means and responsive to the associated comparator signals and to said reference pulse signals, for providing in response to each present reference pulse signal said digital difference magnitude signal and said digital phase signal in dependence on the present state of said discrete signals;

ratiometric analog-to-digital (A/D) converter, having an unknown signal input and a reference signal input, for providing a digital signal representative of the ratio of the unknown signal input magnitude divided by the reference signal input magnitude; and signal steering switch means, responsive to said absolute value signals and said magnitude discrete signal, for presenting the smaller magnitude absolute value signal to said unknown signal input and the larger magnitude absolute value signal to said reference signal input in dependence on the relative magnitude indication of said magnitude discrete signal.

* * * * *

UNITED STATES PATENT AND TRADEMARK OFFICE
CERTIFICATE OF CORRECTION

PATENT NO. : 4,375,636  Page 1 of 2
DATED : March 1, 1983
INVENTOR(S) : Timothy F. Stack, George T. Shoemaker It is certified that error appears in the above-identified patent and that said Letters Patent is hereby corrected as shown below:

Column 1, line 16    after "that" insert --associated--

Column 5, line 11    "$_{XY}$, $_{ZY}$" should read --$\phi_{XY}$, $\phi_{ZY}$--

Column 7, line 20    "$_{XY}$, $_{ZY}$" should read --$\phi_{XY}$, $\phi_{ZY}$--

Column 7, line 27    "$_{XY}$, $_{ZY}$" should read --$\phi_{XY}$, $\phi_{ZY}$--

Column 7, line 35    "$_{XY}$" should read --$\phi_{XY}$--

Column 7, line 41    "$_{ZY}$" should read --$\phi_{ZY}$--

Column 7, line 49    "$_{XY}$" should read --$\phi_{XY}$--

Column 7, line 50    "$_{ZY}$" should read --$\phi_{ZY}$--

Column 7, line 56    "$M_{XZ}$, $_{XY}$, $_{ZY}$" should read --$M_{XZ}$, $\phi_{XY}$, $\phi_{ZY}$--

Column 8, line 36    "$M_{XZ}$, $_{XY}$, $_{ZY}$" should read --$M_{XZ}$, $\phi_{XY}$, $\phi_{ZY}$--

UNITED STATES PATENT AND TRADEMARK OFFICE
CERTIFICATE OF CORRECTION

PATENT NO. : 4,375,636
DATED : March 1, 1983
INVENTOR(S) : Timothy F. Stack, George T. Shoemaker It is certified that error appears in the above-identified patent and that said Letters Patent is hereby corrected as shown below:

Column 10, line 25 (Equation (13))

$$"\alpha = 270° - \mathrm{Tan}^{-1}\left[\frac{1+2\cdot R}{\sqrt{3}}\right];"$$ should read $$--\alpha = 270° - \mathrm{Tan}^{-1}\left[\frac{1-2\cdot R}{\sqrt{3}}\right];--$$

Signed and Sealed this

Fifteenth Day of October 1985

[SEAL]

Attest:

Attesting Officer

DONALD J. QUIGG

Commissioner of Patents and Trademarks—Designate